(12) United States Patent
Okase et al.

(10) Patent No.: US 7,112,268 B2
(45) Date of Patent: Sep. 26, 2006

(54) PLATING DEVICE AND PLATING METHOD

(75) Inventors: Wataru Okase, Shiroyama-machi (JP); Takenobu Matsuo, Tosu (JP)

(73) Assignee: Tokyo Electron Limited, Tokyo (JP)

( * ) Notice: Subject to any disclaimer, the term of this patent is extended or adjusted under 35 U.S.C. 154(b) by 385 days.

(21) Appl. No.: 10/468,781

(22) PCT Filed: Feb. 20, 2002

(86) PCT No.: PCT/JP02/01458
§ 371 (c)(1),
(2), (4) Date: Aug. 21, 2003

(87) PCT Pub. No.: WO02/068730
PCT Pub. Date: Sep. 6, 2002

(65) Prior Publication Data
US 2004/0074763 A1 Apr. 22, 2004

(30) Foreign Application Priority Data
Feb. 26, 2001 (JP) ............................. 2001-051122

(51) Int. Cl.
C25D 7/12 (2006.01)
C25D 17/06 (2006.01)
C25D 17/00 (2006.01)
C25D 17/02 (2006.01)

(52) U.S. Cl. ...................... 205/123; 205/143; 204/242; 204/297.14; 204/297.1

(58) Field of Classification Search ...................... None
See application file for complete search history.

(56) References Cited

U.S. PATENT DOCUMENTS 4,466,864 A * 8/1984 Bacon et al. ................ 205/105
5,227,041 A * 7/1993 Brogden et al. ........ 204/297.05
5,762,504 A * 6/1998 Itoh ............................ 439/66
6,077,405 A 6/2000 Biggs et al.

FOREIGN PATENT DOCUMENTS

JP 06-108296 A * 4/1994
JP 10-032061 A * 2/1998
JP 2001-323397 A 11/2001

OTHER PUBLICATIONS

"New Miniature Contact Springs Insure Electrical Continuity", Servometer, Dec. 1998. (Original URL:www.servometer.com/contacts.html, Obtained from www.archive.org).*
PCT—English Translation of International Preliminary Examination Report.

* cited by examiner

Primary Examiner—Roy King
Assistant Examiner—Harry D. Wilkins, III
(74) Attorney, Agent, or Firm—Pillsbury Winthrop Shaw Pittman LLP (57) ABSTRACT

A plating device and a plating method are provided that are capable of enhancing uniformity in plating on a treatment surface of an object to be treated. The plating device includes: a plating solution bath capable of storing a plating solution and having a first electrode to be immersed in the stored plating solution; a treatment object holding mechanism configured to hold the object to be treated to bring the treatment surface thereof into contact with the plating solution; and a contact disposed in the treatment object holding mechanism and brought into electrical contact with a peripheral edge of the object to be treated so as to make a conductive layer on the treatment surface, which is brought into contact with the plating solution, serve as a second electrode, the contact having a bellows construction or a spring construction movable in a direction facing the object to be treated, and the treatment object holding mechanism being capable of holding the object to be treated while the bellows construction or the like in the contact is in a compressed state. The contact itself is formed as a pliable structure instead of a rigid structure, thereby keeping the contact resistance constant by fluctuation in contact pressure which is controlled to be small even when a slight displacement of the compression direction occurs.

16 Claims, 8 Drawing Sheets

PLATING DEVICE AND PLATING METHOD

This is the U.S. National Stage of International Application No. PCT/JP02/01458, which was filed on Feb. 20, 2002, which designated the U.S and was not filed in the English language.

TECHNICAL FIELD

The present invention relates to a plating device and a plating method for plating a treatment surface of an object to be treated such as a wafer, and more particularly, to the plating device and the plating method suitable for uniformly plating the treatment surface of the object to be treated.

BACKGROUND ART

In accordance with the progress of the microfabrication required in manufacturing semiconductor devices and liquid crystal devices, the frequency of using a plating process, in place of a vapor phase reaction process, in semiconductor manufacturing processes and liquid crystal device manufacturing processes has recently been on the increase. Securing uniform film quality and film thickness of plating over the surface of an object to be treated is generally an important problem in such a plating process for controlling the quality of semiconductors and so on to be manufactured.

A process of copper-plating the surface of a wafer to be treated will be explained as an example of the plating process. When the surface of the wafer to be treated is copper-plated, a conductive seed layer to be a cathode of electrolytic plating and to be a seed of plating is formed on the surface thereof in advance.

The surface of the wafer to be treated on which the seed layer has been formed is immersed in a plating solution bath so as to be in contract with a plating solution containing, for example, copper sulfate as a base, and electric conductors (cathode contacts, which are hereinafter, simply referred to as contacts, when appropriate) are brought into contact with the seed layer from the outer periphery of the wafer so that electricity for electrolytic plating is supplied. A copper anode electrode containing, for example, phosphorous is disposed in the plating solution bath, being immersed in the plating solution.

Through the use of these structures, electricity is supplied between the cathode and the anode to precipitate copper by reduction to the cathode which is originally the seed layer, thereby forming copper on the seed layer as plating.

The electrical contact by the contacts from the outer periphery of the wafer needs to be uniform over the whole outer periphery in a plating device having such a structure. Inferior uniformity results in variation in contact resistances between the contacts and the wafer. Consequently, among the contacts that are in contact with the peripheral edge of the wafer, contacts which are in contact with the wafer with smaller contact resistances have higher conductivity to the wafer while contacts which are in contact with the wafer with larger contact resistances have lower conductivity to the wafer.

Portions on the wafer from the contacts which are in contact therewith with good conductivity to the center of the wafer is actively plated, so that a film formed thereon has a larger thickness compared with that on portions on the wafer from the contacts which are in contact therewith with inferior conductivity to the center of the wafer. In other words, the variation in the contact resistances between the contacts and the wafer causes nonuniform plating on the surface of the wafer to be treated. Therefore, the contacts have to be electrically brought into uniform contact with the whole outer periphery of the wafer from the outer periphery thereof in order to prevent nonuniform plating.

Currently, a well-known method adopted for the purpose of surely securing the electrical contact between the wafer and the contacts is a method in which a contact having a large number of dotted contact points is disposed facing the wafer surface of the wafer peripheral edge, and a rear face of the wafer is pressed in the direction of the contact points.

With the recent increase in the wafer diameter, however, the number of the contacts points to be provided on the contact has been on the increase, and it is getting difficult to uniformly press the contact points to obtain uniform contact for all the contact points. Specifically, the positions of the contact points in a heightwise direction need to be precisely uniform in order to bring the contact points of the contact into uniform contact with the wafer by pressing the rear face of the wafer. As the number of the contact points increases, such securing of the uniformity in the heightwise positions becomes more difficult from the viewpoint of machining and assembly of the device. Further, even when the precision of the machining and assembly is secured, it becomes more difficult to maintain the uniformity in the heightwise positions of the contact points with the increase in the number of the contact points since there exist causes of fluctuation such as abrasion which occurs each time the device is operated.

As is explained above, in the plating device currently used, it is getting difficult to maintain the uniformity in the contact resistances between the contacts and the wafer, and there is a limit to the uniform plating on the treatment surface.

DISCLOSURE OF THE INVENTION

The present invention is made in consideration of the circumstances stated above, and it is an object of the present invention to provide a plating device and a plating method that can enhance uniformity in plating on the treatment surface of the object to be treated.

In order to solve the above-described problem, a plating device according to an aspect of the present invention includes: a plating solution bath capable of storing a plating solution and having a first electrode to be immersed in the stored plating solution; a treatment object holding mechanism configured to hold an object to be treated to bring a treatment surface of the object to be treated into contact with the plating solution; and a contact disposed in the treatment object holding mechanism and brought into electrical contact with a peripheral edge of the object to be treated so as to make a conductive layer on the treatment surface, which is brought into contact with the plating solution, serve as a second electrode, the contact having a bellows construction movable in a direction facing the object to be treated, and the treatment object holding mechanism being capable of holding the object to be treated while the bellows construction of the contact is in a compressed state (claim 1).

In short, the contact has the bellows construction movable in the direction facing the object to be treated, and the contact is brought into contact with the object to be treated while the bellows construction is in the compressed state. In other words, the contact itself is formed as a pliable structure instead of a rigid structure so as to make the fluctuation in the contact pressure small even when a slight displacement of the compression direction occurs. Generally, the fluctuation in a force due to the displacement is large (the displacement is small even when the force is applied) in the rigid structure, while the fluctuation in the force due to the displacement is small (the variation of the force results in a large displacement) in the pliable structure.

Therefore, more uniform plating on the treatment surface of the object to be treated becomes possible since the contact resistance is kept constant by the reduced fluctuation in the contact pressure.

Incidentally, the bellows construction of the contact can be formed by, for example, welding a plurality of single-layer bellows members together. Alternatively, it can be produced in such a manner that a conductive layer is formed by plating or the like on the surface of a bellows-shaped section bar and the section bar is removed thereafter.

A plating device according to another aspect of the present invention includes: a plating solution bath capable of storing a plating solution and having a first electrode to be immersed in the stored plating solution; a treatment object holding mechanism configured to hold an object to be treated to bring a treatment surface of the object to be treated into contact with the plating solution; and a contact disposed in the treatment object holding mechanism and brought into electrical contact with a peripheral edge of the object to be treated so as to make a conductive layer on the treatment surface, which is brought into contact with the plating solution, serve as a second electrode, the contact embracing a spring to allow the contact to move in a direction facing the object to be treated, and the treatment object holding mechanism being capable of holding the object to be treated while the spring in the contact is in a compressed state (claim 4).

In this case, the contact itself embraces the spring to allow the contact to move in the direction facing the object to be treated, and the contact is brought into contact with the object to be treated while the spring is in the compressed state. In short, similarly to the above, the contact itself is formed as a pliable structure instead of a rigid structure so as to make the fluctuation in the contact pressure small even when a slight displacement of the compression direction occurs.

Therefore, more uniform plating on the treatment surface of the object to be treated becomes possible since the contact resistance is kept constant by the reduced fluctuation in the contact pressure.

A plating method according to an aspect of the present invention is a plating method in a plating device including: a plating solution bath capable of storing a plating solution and having a first electrode to be immersed in the stored plating solution; a treatment object holding mechanism configured to hold an object to be treated to bring a treatment surface of the object to be treated into contact with the plating solution; and a contact disposed in the treatment object holding mechanism and brought into electrical contact with a peripheral edge of the object to be treated so as to make a conductive layer on the treatment surface, which is brought into contact with the plating solution, serve as a second electrode, the contact having a bellows construction movable in a direction facing the object to be treated. Here, the characteristic thereof is that it includes: delivering the object to be treated to the treatment object holding mechanism; holding the delivered object to be treated while the bellows construction of the contact is in a compressed state; bringing the treatment surface of the held object to be treated into contact with the plating solution bath in which the plating solution is stored; and plating the treatment surface by applying an electric field between the treatment surface of the object to be treated, which is brought into contact with the plating solution, and the first electrode (claim 7).

This plating method makes it possible to enhance uniformity in plating on the treatment surface of the object to be treated, in the same manner as in the explanation on the means as set forth in claim 1.

A plating method according to another aspect of the present invention is a plating method in a plating device including: a plating solution bath capable of storing a plating solution and having a first electrode to be immersed in the stored plating solution; a treatment object holding mechanism configured to hold an object to be treated to bring a treatment surface of the object to be treated into contact with the plating solution; and a contact disposed in the treatment object holding mechanism and brought into electrical contact with a peripheral edge of the object to be treated so as to make a conductive layer on the treatment surface, which is brought into contact with the plating solution, serve as a second electrode, the contact embracing a spring for allowing the contact to move in a direction facing the object to be treated. Here, the characteristic thereof is that it includes: delivering the object to be treated to the treatment object holding mechanism; holding the delivered object to be treated while the spring in the contact is in a compressed state; bringing the treatment surface of the held object to be treated into contact with the plating solution bath in which the plating solution is stored; and plating the treatment surface by applying an electric field between the treatment surface of the object to be treated, which is brought into contact with the plating solution, and the first electrode (claim 9).

This plating method makes it possible to enhance uniformity in plating on the treatment surface of the object to be treated in the same manner as in the explanation on the means as set forth in claim 4.

BEST MODE FOR CARRYING OUT THE INVENTION

According to the present invention, since a contact itself is formed as a pliable structure instead of a rigid structure so as to make the fluctuation in contact pressure small even when a slight displacement of a compression direction occurs, contact resistance is kept constant by the reduced fluctuation in the contact pressure, which enables the enhancement in uniformity in plating on a treatment surface of an object to be treated.

As a form of an embodiment of the present invention, in a plating device as set forth in claim 1, the contact has a hollow portion, and the plating device further includes a fluid supply mechanism configured to send into the hollow portion a fluid whose pressure is controlled (claim 2).

This enables fine adjustment of the contact pressure between a wafer and the contact. This is because, by the increase in the pressure of the fluid sent into the hollow portion provided in the contact, a force in the direction of expansion is applied to a bellows construction, and this force contributes to the increase in the contact pressure with the wafer surface. The decrease in the fluid pressure results in complete reverse action and effect to lower the contact pressure between the wafer surface and the contact.

As a matter involving all the contact points of the contact, even if a spring constant of the bellows construction changes over time, such fine adjustment still makes it possible to keep the contact pressures constant. Further, when the pressure of the fluid sent into the hollow portion is adjusted individually for each contact point of the contact, the contact pressure control for each contact point of the contact is made possible, and as a result, even when electric conductivity at each contact point fluctuates, the contact resistance can be kept constant individually for each contact point.

Incidentally, as the fluid sent into the hollow portion of the contact, liquid such as oil or gas such as air can be used. For changing the pressure thereof, a method of changing the pressure indirectly by changing the temperature can also be adopted.

The foregoing also applies to a plating device as set forth in claim 4, the "hollow portion disposed in the contact" being substituted by a "space in the contact" and the "bellows construction" being substituted by a "spring" (claim 5).

As another form of an embodiment of the present invention, in the plating device as set forth in claim 1 or claim 2, at least a surface layer of the contact is a metal layer subjected to a water repellent process (claim 3).

The surface layer of the contact is the metal subjected to the water repellent process, which prevents the plating solution and mist thereof from wetting the contact. This reduces the corrosion of metal due to plating solution components and the precipitation of plating solution contents on the surface of the metal, which can eliminate one of the factors that increase the contact resistance.

Incidentally, such a water repellent process can be carried out by, for example, dispersing fluorine-based polymeric fine particles (PTFE) in the metal. In PROTONICS SYSTEM (trademark) as such a process, fine particles with a diameter of, for example, 0.3 µm to 1.0 µm in a ratio of, for example, 20 volume % to 35 volume % are precipitated in a metal with high uniformity. When such a water repellent process is applied to Au, a contact angle with, for example, a pure water is 110°, which exhibits a very good water repellency, so that the use thereof as a contact point of a typical contact results in, for example, about 60 mΩ contact resistance with a copper layer of a wafer, which is in no way inferior to that of single Au.

The foregoing description applies also to a plating device as set forth in claim 4 or claim 5 (claim 6).

As another form of an embodiment of the present invention, provided is a plating method in a plating device including: a plating solution bath capable of storing a plating solution and having a first electrode to be immersed in the stored plating solution; a treatment object holding mechanism configured to hold an object to be treated to bring a treatment surface of the object to be treated into contact with the plating solution; and a contact disposed in the treatment object holding mechanism and brought into electrical contact with a peripheral edge of the object to be treated so as to make a conductive layer on the treatment surface, which is brought into contact with the plating solution, serve as a second electrode, the contact having a bellows construction movable in a direction facing the object to be treated and having a hollow portion therein, and the plating device further including a fluid supply mechanism configured to send into the hollow portion a fluid whose pressure is controlled. This method includes: delivering the object to be treated to the treatment object holding mechanism; holding the delivered object to be treated while the bellows construction of the contact is in a compressed state; adjusting a contact pressure between the held object to be treated and the contact by the fluid supply mechanism; bringing the treatment surface of the held object to be treated into contact with the plating solution bath in which the plating solution is stored; and plating the treatment surface by applying an electric field between the treatment surface of the object to be treated, which is brought into contact with the plating solution, and the first electrode.

As still another form of an embodiment of the present invention, provided is a plating method in a plating device including: a plating solution bath capable of storing a plating solution and having a first electrode to be immersed in the stored plating solution; a treatment object holding mechanism configured to hold an object to be treated to bring a treatment surface of the object to be treated into contact with the plating solution; and a contact disposed in the treatment object holding mechanism and brought into electrical contact with a peripheral edge of the object to be treated so as to make a conductive layer on the treatment surface, which is brought into contact with the plating solution, serve as a second electrode, the contact embracing a spring for allowing the contact to move in a direction facing the object to be treated and having a space therein, and the plating device further including a fluid supply mechanism configured to send into the space a fluid whose pressure is controlled. This method includes: delivering the object to be treated to the treatment object holding mechanism; holding the delivered object to be treated while the spring in the contact is in a compressed state; adjusting a contact pressure between the held object to be treated and the contact by the fluid supply mechanism; bringing the treatment surface of the held object to be treated into contact with the plating solution bath in which the plating solution is stored; and plating the treatment surface by applying an electric field between the treatment surface of the object to be treated, which is brought into contact with the plating solution, and the first electrode.

The foregoing is the plating method in which the same operation and effect as in the explanation on the plating device as set forth in claim 2 or claim 5 are obtained.

Hereinafter, an embodiment of the present invention will be explained with reference to the drawings.

Figure 1:
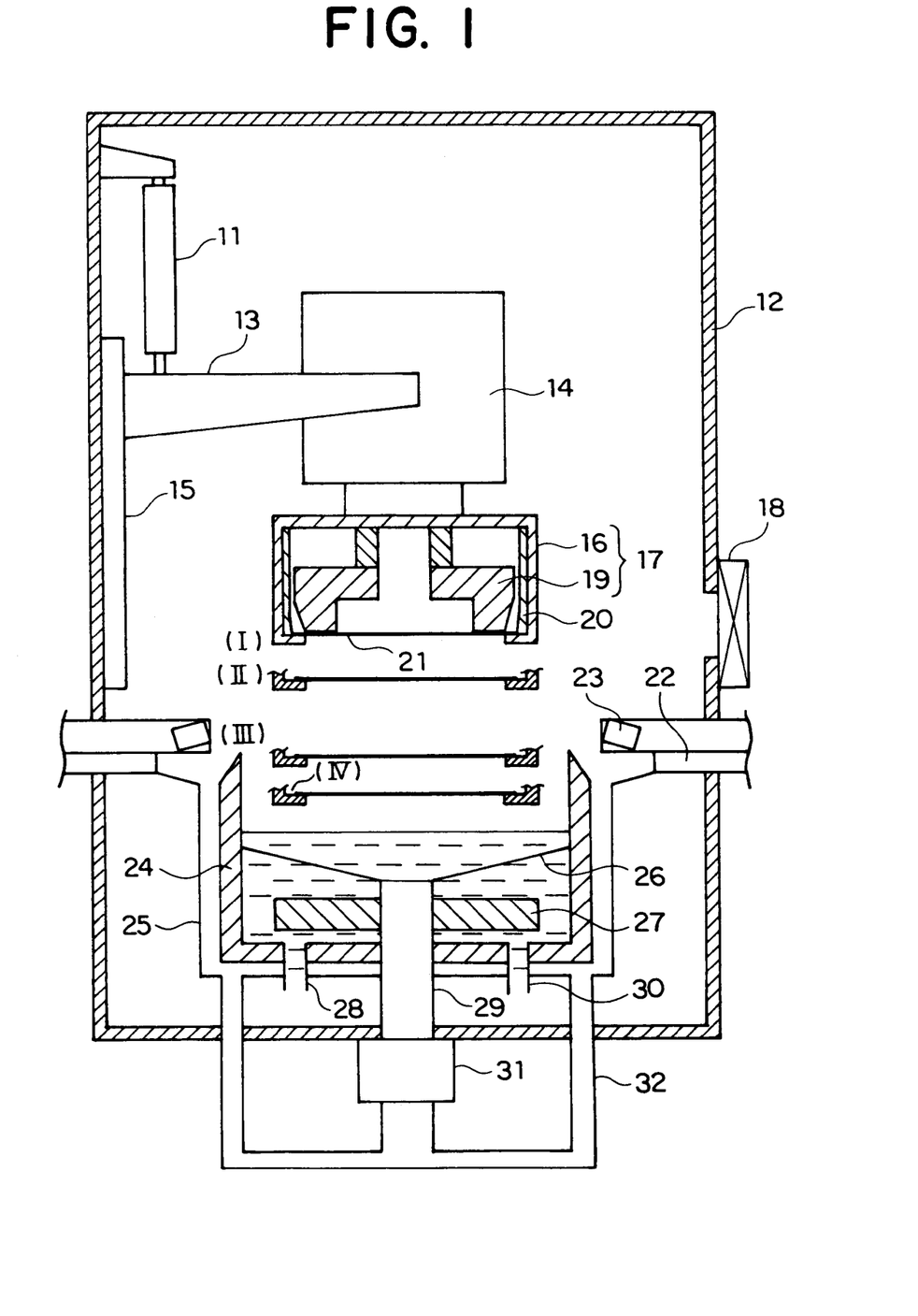
FIG. 1 is a front (fragmentary vertical sectional) view showing the schematic configuration of a plating device as an embodiment of the present invention.

FIG. 1 is a front (fragmentary vertical sectional) view showing the schematic configuration of a plating device as an embodiment of the present invention. As shown in the drawing, this plating device is so structured that the whole device is covered with a housing 12 with a hermetic structure. This housing 12 is made of a plating-solution-resistant material such as synthetic resin.

The inside of the housing 12 is so structured to be vertically divided into two tiers, namely, a first process section positioned on a lower tier and a second process section positioned on an upper tier. The first process section and the second process section are separated by a separator in which washing nozzles 23 and an exhaust port 22 disposed under the washing nozzles 23 are provided. A through hole is provided in the center of this separator so as to allow a wafer 21 held by a wafer holding section 17, which will be described later, to move between the first process section and the second process section. The washing nozzles 23 are arranged in plurality in a circumferential direction of this through hole.

Further, a gate valve 18 through which the wafer 21 is to be transferred into/out of the plating device is disposed on a portion of the housing 12 corresponding to a portion slightly above the boundary between the first process section and the second process section. When this gate valve 18 is closed, the inside of the plating device is turned into a space isolated from a space outside the plating device, so that dispersion of dirt from the plating device to the outside space is prevented.

A plating solution bath 24 is disposed inside the first process section. The plating solution bath 24 has an outer bath 25 attached thereto, which is disposed cocentrically outside the plating solution bath 24. The plating solution bath 24 is so fixed that a surface to be plated of the wafer 21 positioned at a plating position (IV), which will be described later, is lower than the level of a plating solution when the plating solution bath 24 is filled with the plating solution.

The plating solution bath 24 is formed in a substantially cylindrical shape with a closed bottom, and an opening face of the plating solution bath 24 is kept substantially horizontal. Inside the plating solution bath 24, an ejection pipe 29 that ejects the plating solution toward an upper face from a bottom face side of the plating solution bath 24 protrudes from substantially the center of the bottom face of the plating solution bath 24 to substantially the middle of the plating solution bath 24 in a depth direction thereof. An anode electrode 27 substantially in a disc shape is disposed concentrically with the plating solution bath 24 around the ejection pipe 29, and by dissolving this anode electrode 27 in the plating solution containing, for example, copper sulfate, the concentration of copper ions in the plating solution is kept constant.

Further, this anode electrode 27 has a lead wire extending to a not-shown power supply provided outside the outer bath 25, so that an electric field is formed between the anode electrode 27 and the wafer 21 when this power supply is turned on.

A diaphragm 26 vertically partitioning the plating solution bath 24 is provided between an outer periphery of an end portion of the ejection pipe 29 and the plating solution bath 24 above the anode electrode 27, so that the plating solution is supplied from the ejection pipe 29 to an upper side of the plating solution bath 24 partitioned by the diaphragm 26 (hereinafter, referred to as an 'upper side of the plating solution bath') and the plating solution is supplied from a circulation pipe 28, which will be described later, to a lower side of the plating solution bath 24 partitioned by the diaphragm 26 (hereinafter, referred to as a 'lower side of the plating solution bath').

Further, this diaphragm 26 is so formed to allow the penetration therethrough of ions but not to allow the penetration therethrough of impurities generated when the anode electrode 27 is dissolved, and foam, for example, oxygen and hydrogen generated while the surface to be treated of the wafer 21 is being plated. Circulation pipes 28, 30 are disposed at positions deviated from the center of the bottom face of the plating solution bath 24, and a not-shown pump is provided between the circulation pipes 28, 30. The operation of this pump causes the plating solution to be circulated to the lower side of the plating solution bath 24.

The outer bath 25 is formed in a substantially cylindrical shape with a closed bottom, similarly to the plating solution bath 24, and an opening face of the outer bath 25 is kept substantially horizontal. Discharge ports are provided at two places of a bottom portion of the outer bath 25, and a pipe 32 is connected to the discharge ports. A pump 31 is disposed between this pipe 32 and the ejection pipe 29. Note that a not-shown tank storing the plating solution is connected to the pipe 32 via a pump and a valve, and when the valve is opened and the pump is operated, the plating solution in the tank can be supplied to the plating solution bath 24.

Inside the second process section, the wafer holding section 17 as a treatment object holding mechanism configured to hold the wafer 21 is disposed right above the center of the plating solution bath 24. Here, the wafer holding section 17 is composed of a holder 16 and a wafer pressing mechanism 19.

The holder 16 is formed in a substantially cylindrical shape to allow one wafer 21 to be placed in the holder 16 substantially horizontally. A substantially circular opening is formed in a bottom face of the holder 16, so that a plating layer can be formed on the surface to be plated of the wafer 21 placed inside the holder 16.

The wafer pressing mechanism 19 is disposed so as to ensure electrical contact between the wafer 21 and the contacts by pressing a rear face of the wafer 21 placed in the holder 16. For this purpose, it is arranged along the circumferential direction of the wafer 21 so as to be capable of equally pressing an outer periphery side of the wafer 21, and is capable of vertically moving independently from the holder 16. Incidentally, a seal member, which will be described later, is provided along a marginal portion of the opening inside the holder 16, so that the seal member and the above-mentioned pressing can prevent the plating solution from entering the inside of the holder 16.

The wafer holding section 17 is hung from a motor 14 that rotates the wafer 21 together with the wafer holding section 17 on a substantially horizontal plane. The motor 14 is covered with a cover formed of a plating-solution-resistant material such as synthetic resin, which prevents mist vaporized from the plating solution and dispersed mist from entering inside the motor 14.

A support beam 13 supporting the motor 14 is attached to an outer side of the motor 14. An end of the support beam 13 is attached to an inner wall of the housing 12 via a guide rail 15 to be ascendable/descendible. The support beam 13 is also attached to the housing 12 via a cylinder 11 extendable/contractible in a vertical direction, so that the motor 14 supported by the support beam 13 and the wafer holding section 17 vertically moves along the guide rail 15 to ascend/descend the wafer 21 when the cylinder 11 is driven.

To be more specific, this vertical movement is made so as to cause the wafer 21 held by the wafer holding section 17 to ascend/descend among a carry-in/carry-out position (I) for transfer, a washing position (II) for washing, for example, the surface to be plated of the wafer 21 with a wash, for example, a pure water, a spin dry position (III) for later-described spin dry, and the plating position (IV) for forming the plating layer on the surface to be plated of the wafer 21. When the plating solution bath 24 is filled with the plating solution, the carry-in/carry-out position (I) and the washing position (II) are higher than the level of the plating solution, and the spin dry position (III) and the plating position (Iv) are lower than the level of the plating solution.

A copper thin film, a so-called seed layer, is formed in advance by a different device on the surface to be plated of the wafer 21 held by the wafer holding section 17, so that a voltage applied to a cathode contact, which will be described later, is also applied to the surface to be plated of the wafer 21.

A contact-seal presser 20 is provided in the wafer holding section 17. The contact-seal presser 20 is intended for fixing a pedestal portion of the cathode contact, which will be described later, and the seal member onto the holder 16 for fixing. The contact-seal presser 20 is arranged along the circumferential direction of the holder 16.

Figure 2A:
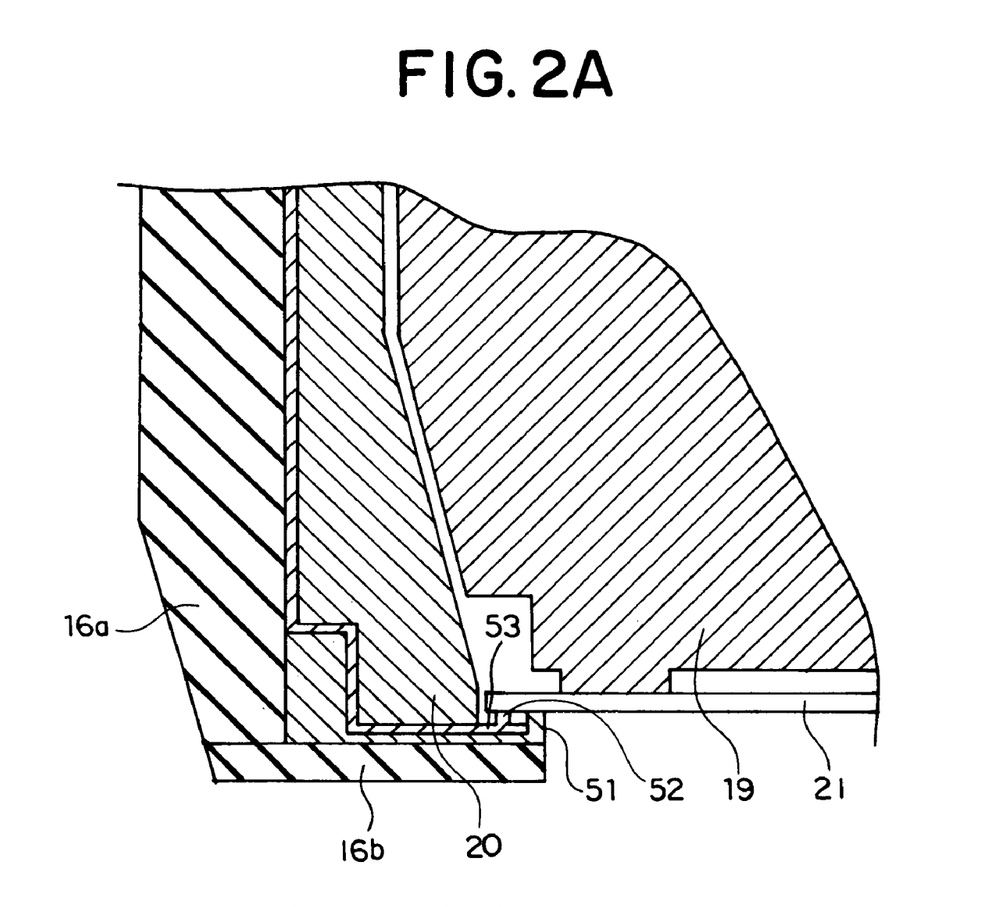
FIG. 2A is a schematic front (fragmentary vertical sectional) view for explaining the state when a wafer holding section 17 holds a wafer 21 in the plating device shown in FIG. 1.
Figure 2B:
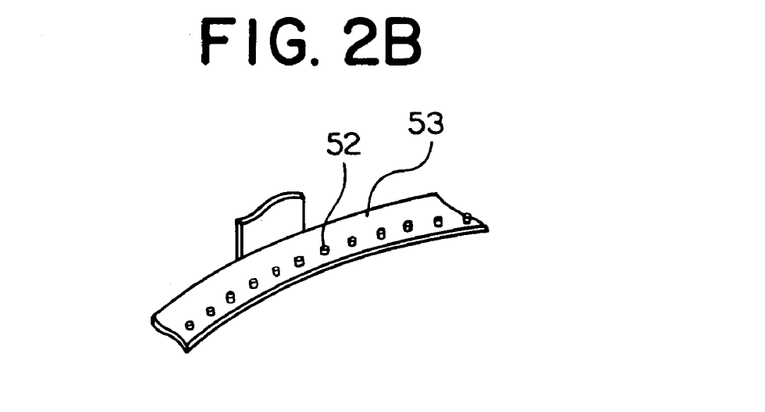
FIG. 2B is a perspective view showing a conductive member therein.

Next, the state when the wafer holding section 17 holds the wafer 21 in the plating device of this embodiment will be explained in detail with reference to FIG. 2A and FIG. 2B. These drawings are a schematic front (fragmentary vertical sectional) view for explaining the state when the wafer holding section 17 holds the wafer 21 (FIG. 2A) and a perspective view showing a conductive member therein (FIG. 2B). In FIG. 2A and FIG. 2B, the same numerals are used to designate the same constituent members as those already explained.

As shown in FIG. 2A, the holder 16 is composed of a side member 16a and a bottom member 16b, and inside thereof, cathode contacts 52 for applying a voltage to the surface to be treated of the wafer 21 are disposed. The cathode contacts 52 are formed of a conductive material, and as shown in FIG. 2B, they are formed to protrude from a conductive pedestal portion 53 of the contact formed substantially in a ring shape along a circumferential direction of the holder 16.

The contacts 52 are formed at a plurality of places, for example, six places to 180 places on the ring-shaped conductive pedestal portion 53. The specific number thereof can be determined within a range not causing a disadvantage in manufacturing, in consideration of realizing the uniformity in electric current while the surface to be plated of the wafer 21 is being plated.

A lead wire is connected to the conductive pedestal portion 53, so that a voltage can be applied thereto from a not-shown external power supply via the lead wire.

A portion of the wafer 21 that is in contact with the contacts 52 is sealed by a seal member 51 so as to prevent the plating solution from entering. The seal member 51 is arranged in a ring shape in the circumferential direction of the holder 16 and protrudes in a ring shape in a direction facing the wafer 21. The seal member 51 is made of an elastic material, for example, rubber, and when the rear face of the wafer 21 is pressed downward by the wafer pressing mechanism 19, the seal member 51 is elastically deformed to secure sealability between the seal member 51 and the surface to be plated of the wafer 21. This eliminates one of the factors deteriorating the contacts 52.

Figure 3A:
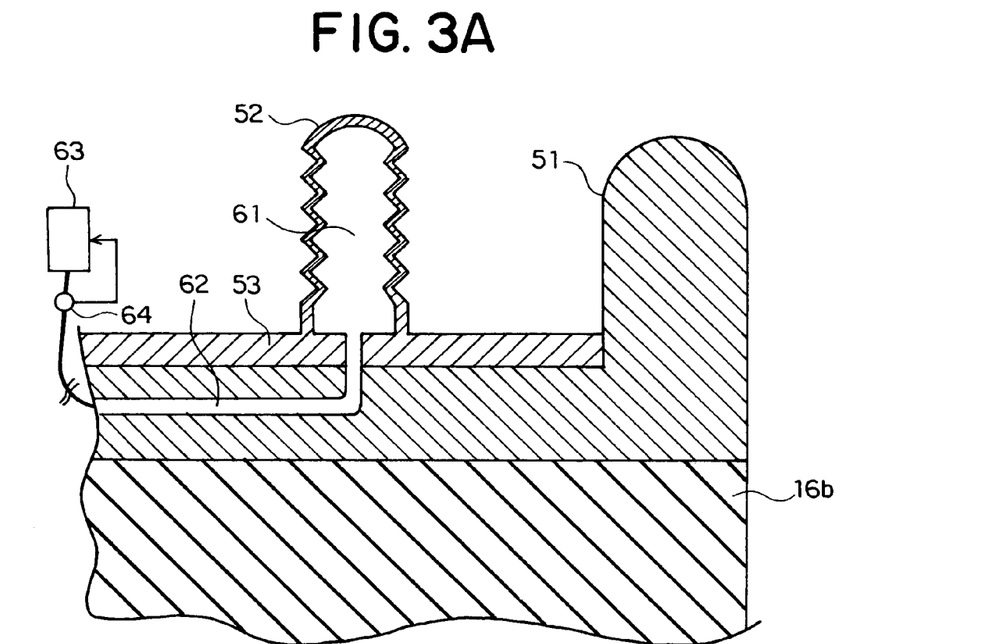
FIG. 3A and FIG. 3B are schematic front (fragmentary vertical sectional) views for explaining the state when a contact 52 shown in FIG. 2A and FIG. 2B comes in contact with the wafer 21.

Next, the state when the contacts 52 come in contact with the wafer 21 in this embodiment will be further explained with reference to FIG. 3A and FIG. 3B. These drawings are schematic front (fragmentary vertical sectional) views for explaining the state when the contact 52 comes in contact with the wafer 21, and the same numerals are used to designate the same constituent elements as those already explained. FIG. 3A shows the state when the wafer 21 is not held and FIG. 3B shows the state when the wafer 21 is held.

As shown in FIG. 3A, the contact 52 is a bellows construction movable in a vertical direction in the drawing, and has a hollow portion 61 therein. A through hole is provided in the conductive pedestal portion 53 so as to communicate with the hollow portion 61, and it also communicates with a fluid supply section 63 as a fluid supply mechanism via a fluid supply passage 62 in the seal member 51.

A pressure detector 64 is provided on a fluid supply output side of the fluid supply section 63, so that the pressure thereof can be detected. The detected pressure can be fedback to the fluid supply section 63. This makes it possible to set the output side of the fluid supply section 63 to be at a predetermined pressure. Under the static condition, this is equivalent to the adjustment of the pressure of the hollow portion 61 in the contact 52.

Figure 3B:
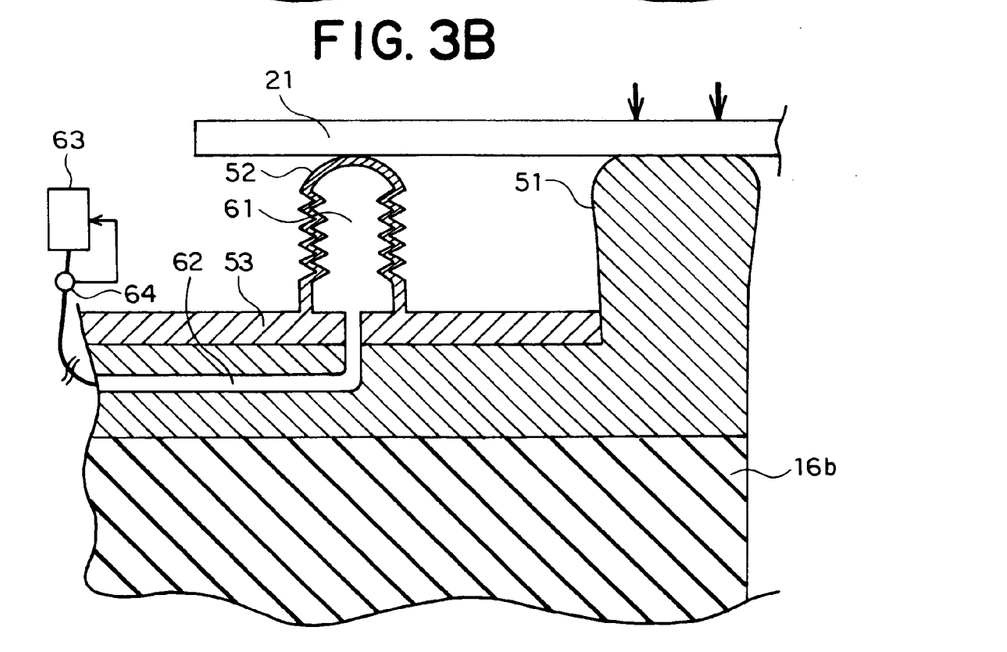

As shown in FIG. 3B, when the wafer 21 is held, the wafer. 21 is pressed from the rear face thereof to cause the elastic deformation of the seal member 51, thereby preventing the solution from entering the contact 52 side. At this time, the contact 52 is also compressed to ensure electrical contact with the conductive layer of the wafer 21. Note that the extending length of the wafer 21 sealed by the seal member 51 is about several mm (for example, 2 mm to 5 mm).

In the above-described electrical contact between the contact 52 and the wafer 21, the variation in the contact pressure in accordance with displacement of the wafer 21 in the vertical direction in the drawing is small. This is because the movement of the expansion/contraction of the contact 52 is made with a smaller force. Therefore, unlike the case when the contact 52 is simply a rigid structure, a large contact pressure fluctuation does not accompany the displacement of the wafer 21 in the vertical direction.

Therefore, the reduced fluctuation in the contact pressure between the wafer 21 and the contact 52 causes the contact resistance constant, which can enhance uniformity in plating on the surface to be treated of the wafer 21. This is an effect obtainable when no adjustment is made of the pressure of the hollow portion 61 by the fluid supply section 63.

When the pressure of the hollow portion 61 is adjusted by the fluid supply section 63, the following effect is further obtained. For example, when the pressure of the hollow portion 61 is adjusted on the increasing side, the contact pressure between the wafer 21 and the contact 52 increases and the contact resistance thereof lowers. Therefore, this can cope with the deterioration of conductivity due to the change in the surface layer of the contact 52. When the fluid supply section 63 and the pressure detector 64 are provided for each of the plural contacts 52, this adjustment can be made individually for each contact 52. The deterioration of the surface layer of the contact 52 possibly occurs because the plating solution has acidity and a corroding property and the adhesion of the plating component reaching the contact 52 as vapor and mist cannot be prevented even by ensuring sealability of the contact 52.

Incidentally, when the pressure of the inside of the hollow portion 61 is not at all controlled, the liquid supply passage 62 on the side opposite the hollow portion 61 is turned into an open state.

As for the manufacture of the bellows construction, it is easier as a manufacturing method to form the bellows construction separately from the conductive pedestal portion 53 and fix the formed bellows construction to the conductive pedestal portion 53. As one method in this case, a method of overlappingly connecting single layer bellows members is adoptable. Alternatively, the bellows construction can be also manufactured in such a manner that a section bar in the same shape as that of the hollow portion 61 is prepared, a layer of a conductive material is formed on the surface thereof by plating or the like, and the section bar is removed after the layer is formed.

Next, a form of the embodiment suitably applied to the surface layer of the contact 52 as described above will be explained with reference to FIG. 4. This drawing is a schematic sectional view for explaining the laminate structure of the surface of the contact 52.

Figure 4:
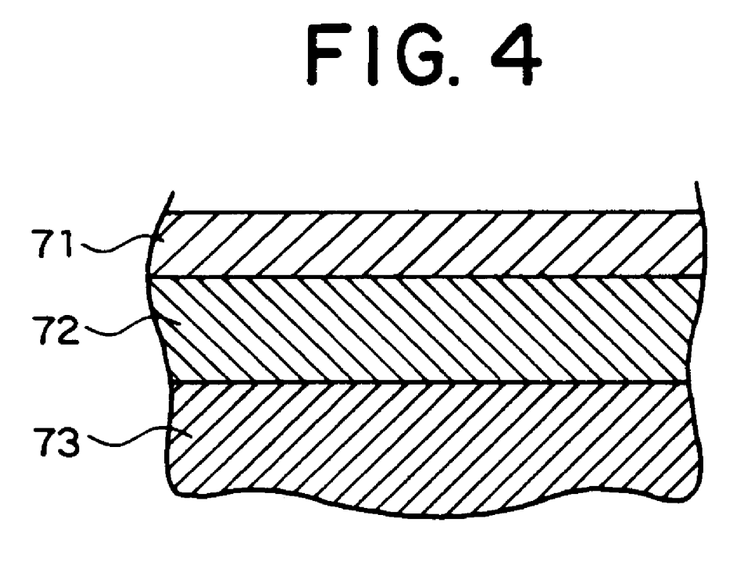
FIG. 4 is a schematic sectional view for explaining an example of the laminate structure of the surface of the contact 52 shown in FIG. 2A, FIG. 2B, FIG. 3A, and FIG. 3B.

As shown in FIG. 4, a layer 71 of Au in which fluorine-based polymeric fine particles are dispersed is formed on an utmost outer layer (outer most surface layer) of the contact 52. Meanwhile, an Ni layer 72 is formed as a base of the layer 71 in advance. As a ground metal of these layers 71, 72, stainless steel (SUS) 73 is usable. Incidentally, the layer 71 can be formed to have a thickness of about 2 μm, and the layer 72 can be formed to have a thickness of about 3 μm.

The Au layer 71 in which the fluorine-based polymeric fine particles are dispersed exhibits remarkably highly improved water repellency compared with that of single Au, and a contact angle with, for example, a pure water is about 110°. Accordingly, the surface of the contact 52 has very good liquid repellency, so that liquid is detached from the surface thereof even when only a small mechanical perturbation is given thereto. This prevents the plating solution reaching the contact 52 from wetting the surface of the contact 52, which can eliminate a cause of the deterioration caused by the corrosion of the surface of the contact 52.

Note that the Au layer 61 in which the fluorine-based polymeric fine particles are dispersed has the contact resistance approximate to that of single Au, the value thereof being, for example, about 55 mΩ to about 63 mΩ. Therefore, this value is small as an absolute value, which means that the causes of the contact resistance variation are lessened.

Figure 5:
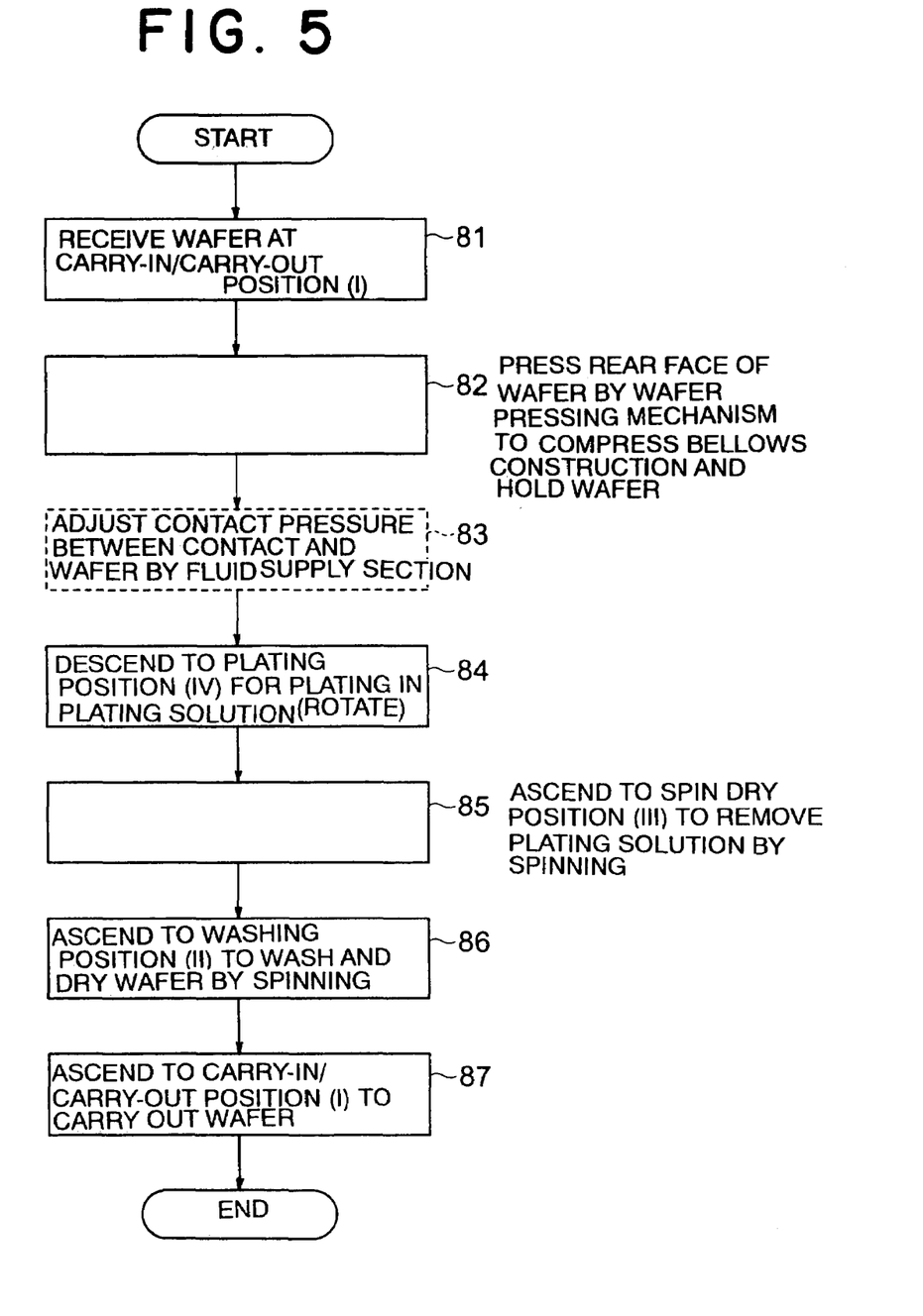
FIG. 5 is a flowchart showing the operation flow in the plating device as the embodiment of the present invention shown in FIG. 1.

Next, the operation of the plating device as the embodiment of the present invention, the structure of which is described above, will be explained with reference also to FIG. 5. FIG. 5. is a flowchart showing the operation flow of the plating device as the embodiment of the present invention.

First, the gate valve 18 provided on a side wall of the plating device is opened, and an arm holding an unprocessed wafer extends to place the wafer substantially horizontally on the holder 16 of the wafer holding section 17 that is on standby at the carry-in/carry-out position (I), with the surface to be treated of the wafer 21 facing the level of the plating solution containing, for example, copper sulfate. This means that the holder 16 receives the wafer 21, with the wafer 21 facing the contacts 52 (Step 81).

After the wafer 21 is placed on the contacts 52, the arm retreats and the gate valve 18 is closed, and at the same time, the wafer pressing mechanism 19 of the wafer holding section 17 presses the rear face of the wafer 21 to compress the bellows constructions of the contacts 52 (Step 82). At this time, the plating solution bath 24 already has the plating solution fully filled therein. By this pressing, a protruding portion of the seal member 51 is surely elastically deformed to repel the wafer 21 in contact therewith due to a generated compressive stress, thereby preventing the plating solution from entering the inside of the wafer holding section 17. Moreover, the compression of the bellows constructions of the contacts 52 surely realizes the electrical contact between the wafer 21 and the contacts 52.

Next, the fluid supply section 63 adjusts the contact pressure between the contacts 52 and the wafer 21 (Step 83). This adjustment is made in order to unify the contact resistances at a smaller level, as previously stated. Incidentally, when neither the fluid supply section 63 nor the pressure detector 64 is provided, this step is not naturally conducted.

Thereafter, while this sealed state is maintained, the wafer holding section 17 is driven by the cylinder 11 to be descended, thereby positioning the wafer 21 at the plating position (IV), and thereafter, the voltage is applied between the anode electrode 27 and the cathode contacts 52, so that the surface to be plated of the wafer 21 is plated with, for example, copper (Step 84). Incidentally, during this plating, the wafer holding section 17 rotates to correct treatment nonuniformity on the wafer 21 caused by the plating solution flow.

After the plating layer with a sufficient thickness is formed on the surface to be plated of the wafer 21, the voltage application is stopped. Then, a predetermined amount of the plating solution is returned to the not-shown tank to lower the level of the plating solution in the plating solution bath 24. After the level of the plating solution is lowered, the wafer holding section 17 is driven by the cylinder 11 to be ascended, thereby positioning the wafer 21 at the spin dry position (III).

The wafer holding section 17 is rotated in this state on a substantially horizontal plane by the drive of the motor 14 for spin drying, thereby removing the excess plating solution adhering onto the plated surface of the wafer 21 (Step 85).

After the sufficient spin dry is performed, the wafer holding section 17 is ascended by the drive of the cylinder 11 to position the wafer 21 at the washing position (II). In this state, the wafer holding section 17 is rotated on a substantially horizontal plane by the drive of the motor 14, and at the same time, a pure water is ejected from the washing nozzles 23, which is incorporated in the separator, toward the surface of the wafer 21 on which the plating layer is formed, thereby washing the surface of the wafer 21 on which the plating layer is formed, and the surface thereof is dried (Step 86).

Thereafter, the wafer holding section 17 is ascended by the drive of the cylinder 11 to position the wafer 21 at the carry-in/carry-out position (I), and the wafer 21 is carried out (Step 87). With this operation, a series of the operations is finished.

As explained above, in the plating device of this embodiment, each of the contacts 52 has the bellows construction movable in the direction facing the wafer 21, and the contacts 52 and the wafer 21 are in contact with each other while the bellows constructions are in the compressed state. Accordingly, the contacts 52 themselves become pliable structures, so that the fluctuation in the contact pressure is small even when the slight displacement of the compression direction occurs. Consequently, the contact resistance is kept constant due to the reduced fluctuation in the contact pressure, which can enhance uniformity in plating on the surface to be treated of the wafer.

Figure 6A:
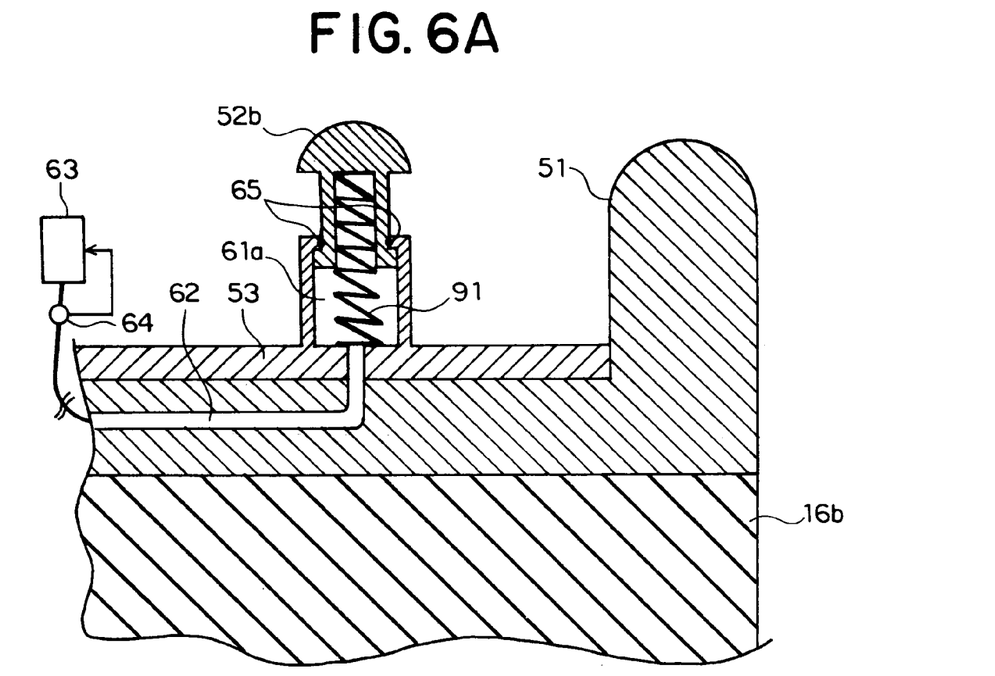
FIG. 6A and FIG. 6B are schematic front (fragmentary vertical sectional) views for explaining the state different from that shown in FIG. 3A and FIG. 3B when a contact comes in contact with the wafer 21.
Figure 6B:
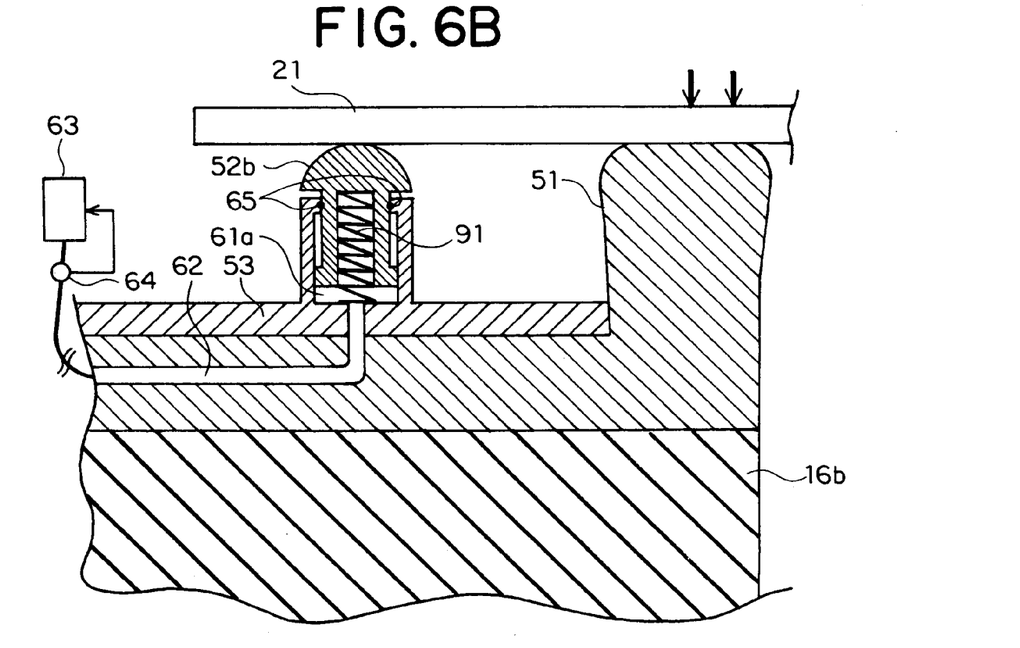

Next, an example of another contact adoptable in place of the contact 52 shown in FIG. 3A and FIG. 3B will be explained with reference to FIG. 6A and FIG. 6B. FIG. 6A and FIG. 6B are schematic front (fragmentary vertical sectional) views for explaining the state different from that shown in FIG. 3A and FIG. 3B when a contact comes in contact with the wafer 21, and the same numerals are used to designate the same constituent elements as those already explained. FIG. 6A shows the state when the wafer 21 is not held and FIG. 6B shows the state when the wafer 21 is held.

As shown in FIG. 6A, a contact 52b has a structure movable in a vertical direction in the drawing. In more detail, the contact 52b, which embraces a spring 91 therein, is movable in the compression/extension direction of the spring 91 and has a space 61a for embracing the spring 91. Further, a through hole is provided in a conductive pedestal portion 53 so as to communicate with the space 61a and it also communicates with a fluid supply section 63 as a fluid supply mechanism via a fluid supply passage 62 in a seal member 51, similarly to the example shown in FIG. 3A and FIG. 3B. Note that the reference numeral 65 denotes a seal ring.

Owing to the contact 52b thus structured, the variation in contact pressure in accordance with the vertical displacement of the wafer 21 becomes small in the electrical contact between the contact 52b and the wafer 21, similarly to the explanation in FIG. 3A and FIG. 3B. This means that the contact resistance is kept constant owing to the reduced fluctuation in the contact pressure between the wafer 21 and the contact 52b, which enhances uniformity in plating on the surface to be plated of the wafer 21.

Note that the effect brought about by the adjustment of the pressure of the space 61a by the fluid supply section 63 is the same as that explained in FIG. 3A and FIG. 3B.

As for the manufacture of the structure of the contact 52b as shown in FIG. 6A and FIG. 6B, separate formation thereof from the conductive pedestal portion 53 is easier as a manufacturing method. Further, the effect brought about by subjecting a surface layer of the contact 52b to the process as shown in FIG. 4 is also the same as that explained therein.

Figure 7A:
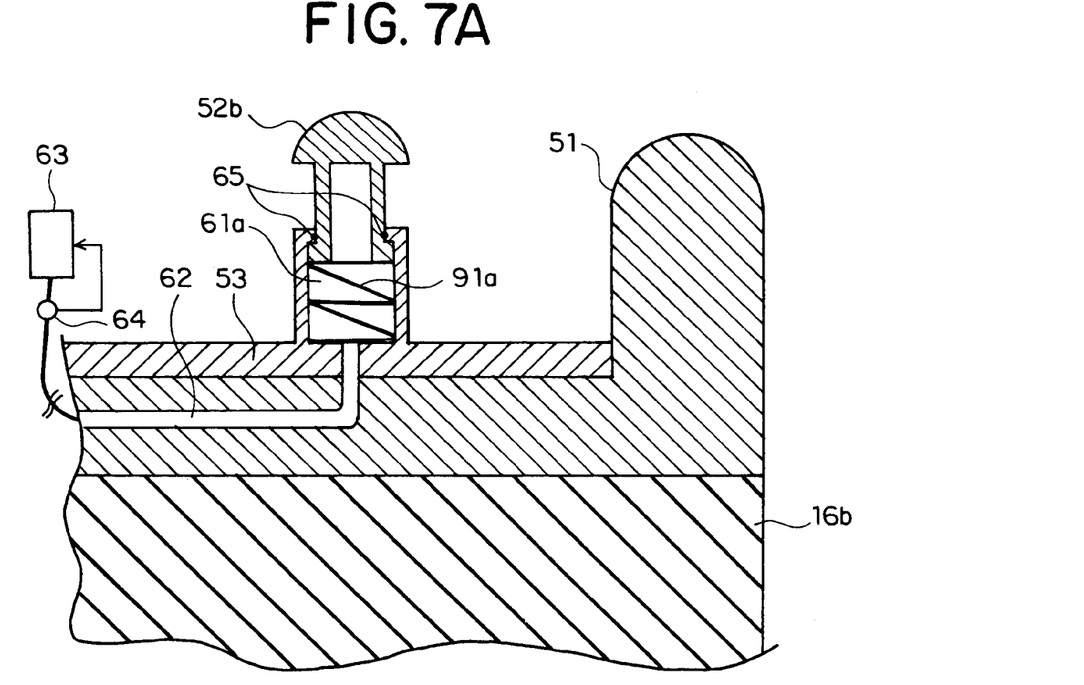
FIG. 7A and FIG. 7B are schematic front (fragmentary vertical sectional) views for explaining the state different from that shown in FIG. 3A, FIG. 3B, FIG. 6A, and FIG. 6B when a contact comes in contact with the wafer 21.
Figure 7B:
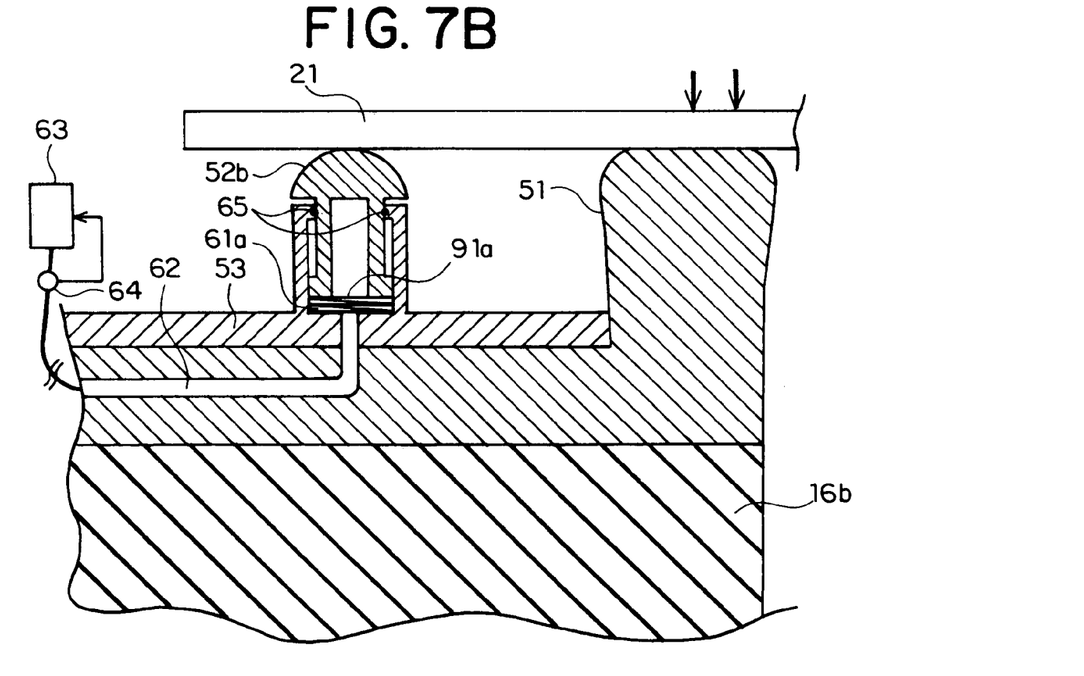

Next, an example of another contact which is adoptable in place of the contacts 52, 52b as shown in FIG. 3A, FIG. 3B, FIG. 6A, and FIG. 6B will be explained with reference to FIG. 7A and FIG. 7B. FIG. 7A and FIG. 7B are schematic front (fragmentary vertical sectional) views for explaining the state different from those shown in FIG. 3A, FIG. 3B, FIG. 6A, and FIG. 6B when a contact comes in contact with the wafer 21, and the same numerals are used to designate the same constituent elements as those already explained. FIG. 7A shows the state when the wafer 21 is not held and FIG. 7B shows the state when the wafer 21 is held.

As shown in FIG. 7A and FIG. 7B, in this example, a spring 91a larger in winding diameter is used in place of the spring 91 shown in FIG. 6A and FIG. 6B. Such a structure also makes it possible to obtain the same effect as that obtained in the example in FIG. 6A and FIG. 6B. Note that, in the contact 52b shown in FIG. 7A and FIG. 7B, the spring 91 shown in FIG. 6A and FIG. 6B may of course be used in addition to the spring 91a at the same time.

Figure 8:
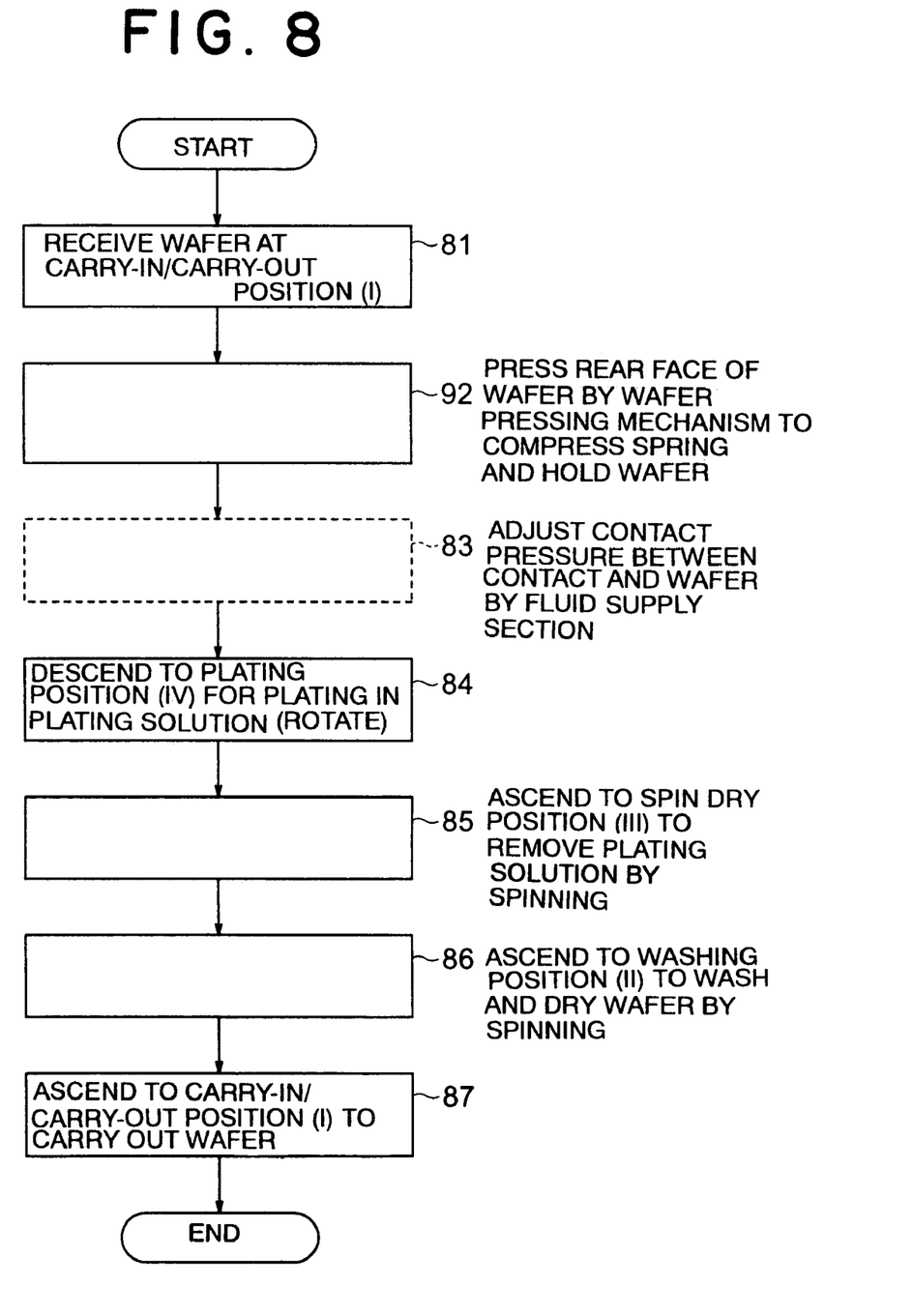
FIG. 8 is a flowchart showing the operation flow in a plating device having a contact 52b shown in FIG. 6A and FIG. 6B or FIG. 7A and FIG. 7B.

FIG. 8 is a flowchart showing the operation flow in the plating device having the contacts 52b as shown in FIG. 6A and FIG. 6B or FIG. 7A and FIG. 7B. In FIG. 8, the same numerals are used to designate the same steps as those already explained, and therefore, this operation flow is substantially the same as the operation flow shown in FIG. 5. In Step 92, the wafer 21 is held so as to compress the spring 91 or 91a. This ensures the electrical contact between the wafer 21 and the contacts 52b.

It should be noted that the present invention is also applicable when the object to be treated is that in a square shape such as a substrate for a liquid crystal display, even though the circular wafer is taken as an example of the object to be treated in the foregoing explanation.

INDUSTRIAL APPLICABILITY

A plating device according to the present invention can be manufactured in the manufacturing industry of semiconductor manufacturing devices. Further, the manufactured plating device is usable in the semiconductor manufacturing industry. A plating method according to the present invention is usable in the semiconductor manufacturing industry. Therefore, all of them have industrial applicability.

What is claimed is:

1. A plating device comprising:
   a plating solution bath capable of storing a plating solution and having a first electrode to be immersed in the stored plating solution;
   a treatment object holding mechanism configured to hold an object to be treated to bring a treatment surface of the object to be treated into contact with the plating solution;
   a contact disposed in said treatment object holding mechanism and brought into electrical contact with a peripheral edge of the object to be treated so as to make a conductive layer on the treatment surface, which is brought into contact with the plating solution, serve as a second electrode, said contact having a bellows construction movable in a direction facing the object to be treated and having a hollow portion; and
   a fluid supply mechanism configured to send into said hollow portion a fluid whose pressure is controlled,
   wherein said treatment object holding mechanism is capable of holding the object to be treated while said bellows construction of said contact is in a compressed state.

2. A plating device as set forth in claim 1, wherein at least a surface layer of said contact is a metal layer subjected to a water repellent process.

3. A plating device as set forth in claim 1,
   wherein said treatment object holding mechanism includes a pressing mechanism capable of pressing a rear surface that is opposite the treatment surface of the object to be treated.

4. A plating device as set forth in claim 1,
   wherein said treatment object holding mechanism includes a seal member capable of coming into contact with a peripheral portion of the object to be treated and deforming elastically to prevent the plating solution from entering an inside of said treatment object holding mechanism.

5. A plating device as set forth in claim 1, further comprising a motor capable of rotating said treatment object holding mechanism.

6. A plating device comprising:
   a plating solution bath capable of storing a plating solution and having a first electrode to be immersed in the stored plating solution;
   a treatment object holding mechanism configured to hold an object to be treated to bring a treatment surface of the object to be treated into contact with the plating solution;
   a contact disposed in said treatment object holding mechanism and brought into electrical contact with a peripheral edge of the object to be treated so as to make a conductive layer on the treatment surface, which is brought into contact with the plating solution, serve as a second electrode, said contact embracing a spring to allow said contact to move in a direction facing the object to be treated and having a space therein; and a fluid supply mechanism configured to send into said space a fluid whose pressure is controlled, wherein said treatment object holding mechanism is capable of holding the object to be treated while said spring in said contact is in a compressed state.

7. A plating device as set forth in claim 6, wherein at least a surface layer of said contact is a metal layer subjected to a water repellent process.

8. A plating device as set forth in claim 6, wherein said treatment object holding mechanism includes a pressing mechanism capable of pressing a rear surface that is opposite the treatment surface of the object to be treated.

9. A plating device as set forth in claim 6, wherein said treatment object holding mechanism includes a seal member capable of coming into contact with a peripheral portion of the object to be treated and deforming elastically to prevent the plating solution from entering an inside of said treatment object holding mechanism.

10. A plating device as set forth in claim 6, further comprising a motor capable of rotating said treatment object holding mechanism.

11. A plating method in a plating device comprising:

a plating solution bath capable of storing a plating solution and having a first electrode to be immersed in the stored plating solution;

a treatment object holding mechanism configured to hold an object to be treated to bring a treatment surface of the object to be treated into contact with the plating solution; and a contact disposed in said treatment object holding mechanism and brought into electrical contact with a peripheral edge of the object to be treated so as to make a conductive layer on the treatment surface, which is brought into contact with the plating solution, serve as a second electrode, said contact having a bellows construction movable in a direction facing the object to be treated and having a hollow portion, and said plating device further comprising a fluid supply mechanism configured to send into said hollow portion a fluid whose pressure is controlled, said plating method comprising:

delivering the object to be treated to said treatment object holding mechanism;

holding the delivered object to be treated while said bellows construction of said contact is in a compressed state;

adjusting a contact pressure between the held object to be treated and said contact by said fluid supply mechanism;

bringing the treatment surface of the held object to be treated into contact with said plating solution bath in which the plating solution is stored; and plating the treatment surface by applying an electric field between the treatment surface of the object to be treated, which is brought into contact with the plating solution, and the first electrode.

12. A plating method as set forth in claim 11, wherein said treatment object holding mechanism of said plating device includes a pressing mechanism capable of pressing a rear surface that is opposite the treatment surface of the object to be treated, said plating method further comprising pressing the rear surface that is opposite the treatment surface of the object to be treated, the object being delivered to said treatment object holding mechanism.

13. A plating method as set forth in claim 11, wherein said plating device further comprises a motor capable of rotating said treatment object holding mechanism, said plating method further comprising rotating said treatment object holding mechanism holding the object to be treated.

14. A plating method in a plating device comprising:

a plating solution bath capable of storing a plating solution and having a first electrode to be immersed in the stored plating solution;

a treatment object holding mechanism configured to hold an object to be treated to bring a treatment surface of the object to be treated into contact with the plating solution; and a contact disposed in said treatment object holding mechanism and brought into electrical contact with a peripheral edge of the object to be treated so as to make a conductive layer on the treatment surface, which is brought into contact with the plating solution, serve as a second electrode, said contact embracing a spring for allowing said contact to move in a direction facing the object to be treated and having a space therein, and said plating device further comprising a fluid supply mechanism configured to send into said space a fluid whose pressure is controlled, said plating method comprising:

delivering the object to be treated to said treatment object holding mechanism; holding the delivered object to be treated while said spring in said contact is in a compressed state;

adjusting a contact pressure between the held object to be treated and said contact by said fluid supply mechanism;

bringing the treatment surface of the held object to be treated into contact with said plating solution bath in which the plating solution is stored; and plating the treatment surface by applying an electric field between the treatment surface of the object to be treated, which is brought into contact with the plating solution, and the first electrode.

15. A plating method as set forth in claim 14, wherein said treatment object holding mechanism of said plating device includes a pressing mechanism capable of pressing a rear surface that is opposite the treatment surface of the object to be treated, said plating method further comprising pressing the rear surface that is opposite the treatment surface of the object to be treated, the object being delivered to said treatment object holding mechanism.

16. A plating method as set forth in claim 14, wherein said plating device further comprises a motor capable of rotating said treatment object holding mechanism, said plating method further comprising rotating said treatment object holding mechanism holding the object to be treated.

* * * * *